(12) United States Patent
Eom et al.

(10) Patent No.: US 10,115,708 B2
(45) Date of Patent: Oct. 30, 2018

(54) SEMICONDUCTOR PACKAGE HAVING A REDISTRIBUTION LINE STRUCTURE

(71) Applicant: SK hynix Inc., Icheon-si, Gyeonggi-do (KR)

(72) Inventors: Ju Il Eom, Guri-si (KR); Jae Hoon Lee, Icheon-si (KR); Sang Joon Lim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 2 days.

(21) Appl. No.: 15/443,509

(22) Filed: Feb. 27, 2017

(65) Prior Publication Data

US 2018/0138150 A1 May 17, 2018

(30) Foreign Application Priority Data

Nov. 16, 2016 (KR) .................. 10-2016-0152358

(51) Int. Cl.
*H01L 25/065* (2006.01)
*H01L 23/00* (2006.01)
*H01L 23/31* (2006.01)

(52) U.S. Cl.
CPC .......... *H01L 25/0657* (2013.01); *H01L 24/02* (2013.01); *H01L 24/09* (2013.01); *H01L 24/17* (2013.01); *H01L 23/3128* (2013.01); *H01L 2224/02331* (2013.01); *H01L 2224/0912* (2013.01); *H01L 2224/17104* (2013.01); *H01L 2225/0652* (2013.01); *H01L 2225/06513* (2013.01); *H01L 2225/06527* (2013.01); *H01L 2225/06562* (2013.01); *H01L 2225/06586* (2013.01)

(58) Field of Classification Search
None
See application file for complete search history.

(56) References Cited

U.S. PATENT DOCUMENTS

| | | | |
|---|---|---|---|
| 2007/0170575 A1* | 7/2007 | Lee | H01L 23/66 257/686 |
| 2008/0150157 A1* | 6/2008 | Nishimura | H01L 21/563 257/777 |
| 2017/0141092 A1* | 5/2017 | Kim | H01L 25/18 |

FOREIGN PATENT DOCUMENTS

| KR | 1020080002073 A | 1/2008 |
|---|---|---|
| KR | 1020090084403 A | 8/2009 |

* cited by examiner

*Primary Examiner* — Long Pham
(74) *Attorney, Agent, or Firm* — William Park & Associates Ltd.

(57) ABSTRACT

A semiconductor package may include a first semiconductor chip having first bonding pads on a first active surface. The semiconductor package may include a second semiconductor chip having second bonding pads which are arranged on a second active surface. The first and second semiconductor chips are stacked such that the first and second active surfaces face each other.

20 Claims, 8 Drawing Sheets

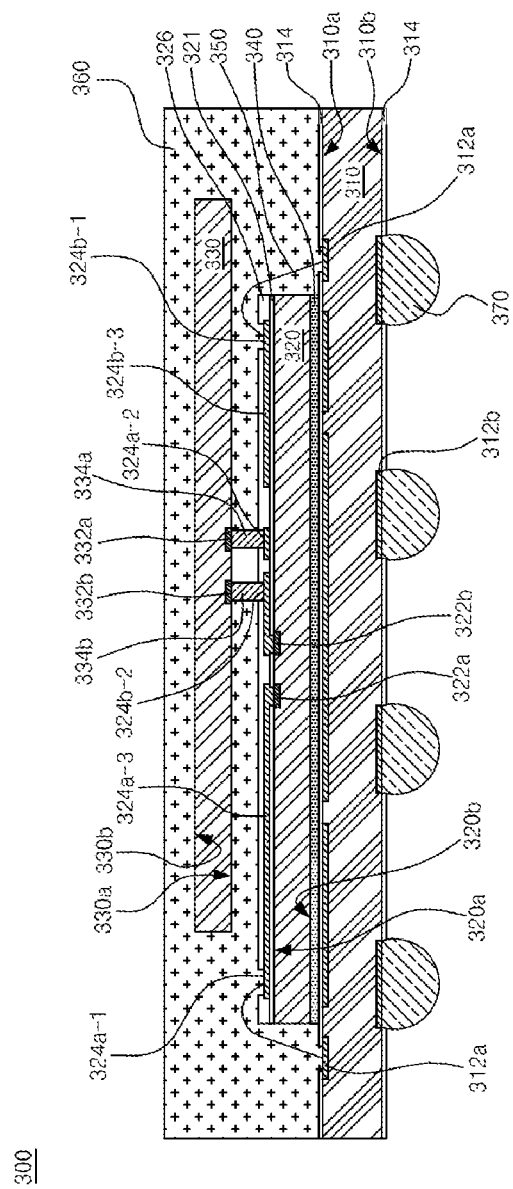

US 10,115,708 B2

SEMICONDUCTOR PACKAGE HAVING A REDISTRIBUTION LINE STRUCTURE

CROSS-REFERENCE TO RELATED APPLICATION

The present application claims priority to Korean Patent Application No. 10-2016-0152358 filed on Nov. 16, 2016, in the Korean Intellectual Property Office, which is incorporated herein by reference in its entirety.

BACKGROUND

1. Technical Field

Various embodiments may generally relate to a semiconductor package, and more particularly, to a semiconductor package including a redistribution line structure.

2. Related Art

As is generally known in the art, when mounting a memory chip to a system, a method is mainly used, in which a memory module constructed in the form of a module is fitted into the socket of a system board. Additionally, because a high capacity memory is demanded in a system, a memory module having a higher density and higher speed characteristics is desired.

In this regard, since it is difficult due to a limitation in the semiconductor integration technology to fabricate a single memory chip product having a required capacity, a method is currently used, in which a plurality of memory chips are stacked to create a high capacity memory. Also, in order to fabricate a high density module, a package of the type of an MCP (multi-chip package) in which a plurality of memory chips are embedded in one package is fabricated.

Also, it is important to decrease the capacitance load of a package which is mounted in a memory module in order to ensure a reliable high speed operation of a system.

SUMMARY

In an embodiment, a semiconductor package may be provided. A semiconductor package may include a first semiconductor chip having first bonding pads on a first active surface. The semiconductor package may include a second semiconductor chip having second bonding pads which are arranged on a second active surface. The first and second semiconductor chips are stacked such that the first and second active surfaces face each other.

BRIEF DESCRIPTION OF THE DRAWINGS

FIG. 5 is a cross-sectional view illustrating a representation of an example of a semiconductor package in accordance with an embodiment.

DETAILED DESCRIPTION

Hereinafter, a stack type semiconductor package having a redistribution line structure may be described below with reference to the accompanying drawings through various examples of embodiments.

Various embodiments may disclose semiconductor packages capable of decreasing an input capacitance ($C_i$). Also, various embodiments may disclose semiconductor packages capable of increasing the operation speed of a memory module through decreasing the input capacitance ($C_i$).

In an R-DIMM (registered dual in-line memory module) according to a fly-by topology, a memory controller is disposed at the center portion of a module substrate. The memory controller is coupled in series with memory packages which are disposed on both sides, and the distal ends of coupling lines are coupled to the ground to prevent a signal from being reflected and returned.

Figure 1:
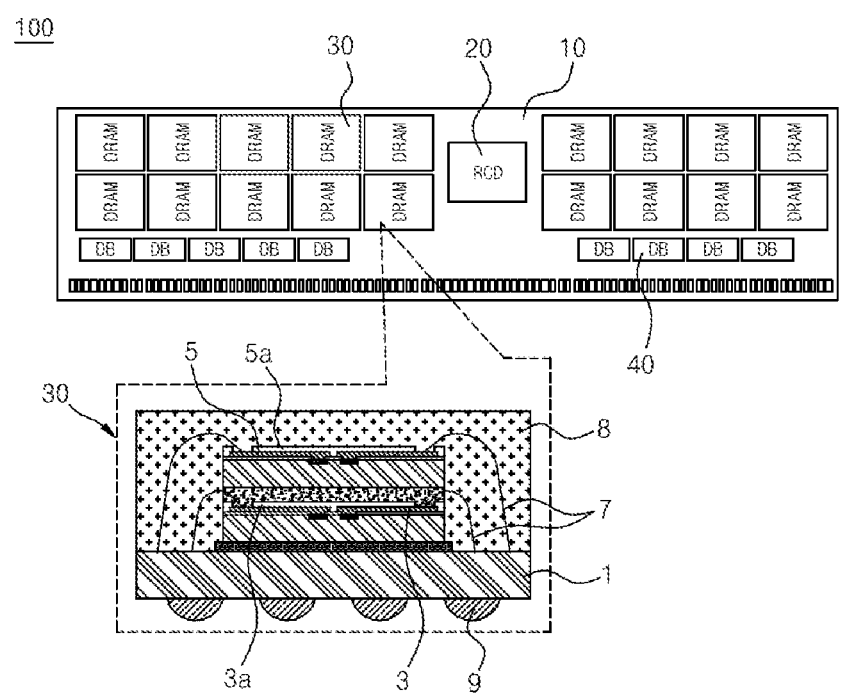
FIG. 1 is a view illustrating a representation of an example of a DIMM (dual in-line memory module) and a conventional dual die package.

FIG. 1 illustrates a 4 rank×4 LR-DIMM (load-reduced DIMM) among R-DIMMs and a memory package mounted in the DIMM.

Referring to FIG. 1, in a DIMM 100, 10 memory packages 30 on the left side of an RCD (register clock driver) 20 and 8 memory packages 30 on the right side of the RCD 20 may be coupled to the RCD 20 as a memory controller, in a fly-by topology. While not illustrated in the drawing, since memories may be mounted to both surfaces of the DIMM 100, a total of 36 memory packages 30 may be mounted. In the case where each memory package 30 is a dual die package, since 2 memory chips are included in each package, a total of 72 memory chips may be coupled to the RCD 20.

The operation speed of such a memory module is influenced by the input capacitance ($C_i$) of the mounted packages. Therefore, by decreasing the input capacitance ($C_i$) of each package, the operation speed of the memory module may be improved.

Referring to FIG. 1, the reference symbol 1 designates a substrate, 3 and 5 designate redistribution lines (RDL), 3a and 5a designate redistribution line insulation layers, 7 designates bonding wires, 8 designates an encapsulation member, 9 designates external coupling electrodes, 10 designates a module substrate, and 40 designates data buffers.

Figure 2:
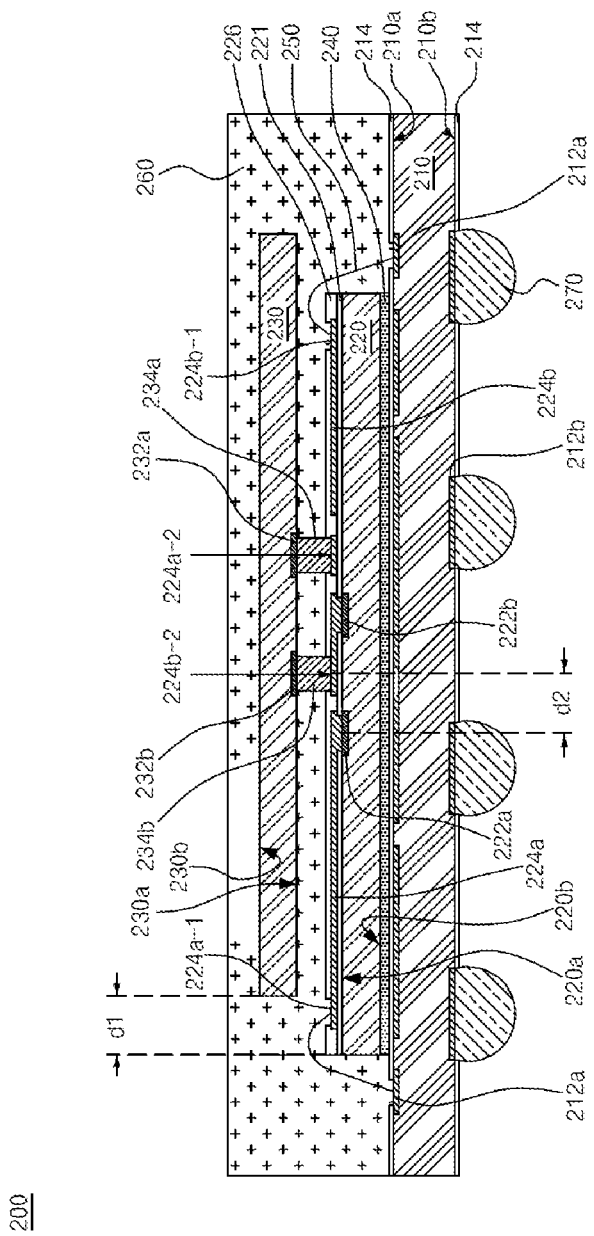
FIG. 2 is a cross-sectional view illustrating a representation of an example of a semiconductor package in accordance with an embodiment.

Referring to FIG. 2, a semiconductor package 200 in accordance with an embodiment may include a substrate 210, a first semiconductor chip 220, and a second semiconductor chip 230. The semiconductor package 200 may further include an adhesive 240, bonding wires 250, an encapsulation member 260, and external coupling electrodes 270.

The substrate 210 may be a printed circuit board. The substrate 210 may have a substantially quadrangular plate shape. The substrate 210 may include a plurality of bond fingers 212a which are arranged on a top surface 210a and a plurality of external electrodes 212b which are arranged on a bottom surface 210b. In an embodiment, the bond fingers 212a may be arranged adjacent to both side edges of the first semiconductor chip 220. The substrate 210 may further include solder resists 214 which are formed on the top surface 210a and the bottom surface 210b in such a way as to expose the bond fingers 212a and the external electrodes 212b.

While not illustrated, the substrate 210 may include internal wiring lines which are formed therein, and the bond fingers 212a and the external electrodes 212b may be electrically coupled with each other by the internal wiring lines.

The first semiconductor chip 220 may be a memory chip. The memory chip may include, for example but not limited to, a DRAM chip or a NAND chip. The memory chip may include any one of other kinds of semiconductor memory chips. The first semiconductor chip 220 may have a substantially quadrangular plate shape. The first semiconductor chip 220 may have a first active surface 220a and a first back surface 220b which faces away from the first active surface 220a. The first semiconductor chip 220 may be disposed on the top surface 210a of the substrate 210 by the medium of the adhesive 240 such that the first back surface 220b faces the top surface 210a of the substrate 210. The first semiconductor chip 220 may include a plurality of first bonding pads 222a and 222b which are arranged on the first active surface 220a. The first bonding pads 222a and 222b may be arranged on the middle portion of the first active surface 220a of the first semiconductor chip 220. The first semiconductor chip 220 may include a plurality of redistribution lines 224a and 224b which are formed on the first active surface 220a.

Figure 3A:
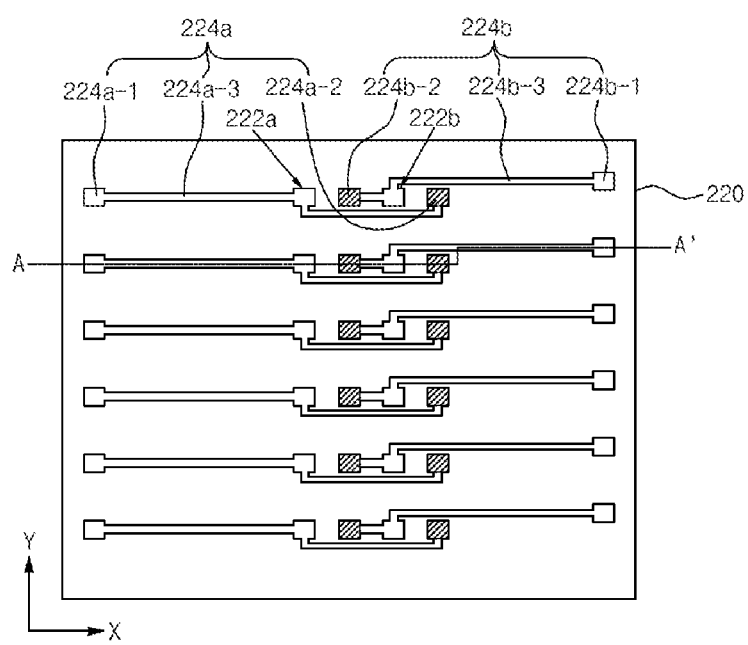
FIG. 3A is a plan view illustrating a representation of an example of the first semiconductor chip of the semiconductor package illustrated in FIG. 2.
Figure 3B:
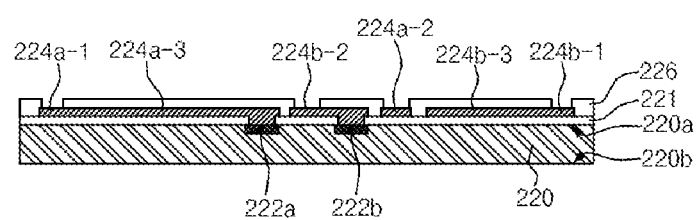
FIG. 3B is a cross-sectional view taken along the line A-A' of FIG. 3A.

Referring to FIGS. 3A and 3B, the first bonding pads 222a and 222b may be disposed to be separated from each other in a first direction X, and may be arranged in two rows along a second direction Y substantially perpendicular to the first direction X on the middle portion of the first active surface 220a of the first semiconductor chip 220. The redistribution lines 224a and 224b may include wire bonding pads 224a-1 and 224b-1, redistribution line pads 224a-2 and 224b-2 and coupling lines 224a-3 and 224b-3.

For example, the following descriptions will be made on the assumption that, for the sake of convenience in explanation, one side indicates the left side and the other side indicates the right side in the drawings.

The redistribution lines 224a and 224b may include first redistribution lines 224a which extend from the middle portion to one side edge portion of the first active surface 220a of the first semiconductor chip 220 and second redistribution lines 224b which extend from the middle portion to the other side edge portion of the first active surface 220a of the first semiconductor chip 220.

Each first redistribution line 224a may include a first wire bonding pad 224a-1, a first redistribution line pad 224a-2, and a first coupling line 224a-3 which couples the first wire bonding pad 224a-1 and the first redistribution line pad 224a-2 via one side first bonding pad 222a. Each second redistribution line 224b may include a second wire bonding pad 224b-1, a second redistribution line pad 224b-2, and a second coupling line 224b-3 which couples the second wire bonding pad 224b-1 and the second redistribution line pad 224b-2 via the other side first bonding pad 222b. The first wire bonding pad 224a-1 may be disposed adjacent to one side edge of the first semiconductor chip 220. The first redistribution line pad 224a-2 may be disposed adjacent to the other side first bonding pad 222b between the other side first bonding pad 222b and the other side edge of the first semiconductor chip 220. The second wire bonding pad 224b-1 may be disposed adjacent to the other side edge of the first semiconductor chip 220. The second redistribution line pad 224b-2 may be disposed between one side first bonding pad 222a and the other side first bonding pad 222b.

In an embodiment, one side first bonding pad 222a, the other side first bonding pad 222b, the first redistribution line pad 224a-2 and the second redistribution line pad 224b-2 may be disposed by being aligned in a line in the first direction X. According to this fact, when the second semiconductor chip 230 is stacked over the first semiconductor chip 220, the first semiconductor chip 220 and the second semiconductor chip 230 may form a staircase structure.

Although descriptions will be made later again, the first bonding pads 222a and 222b and the redistribution line pads 224a-2 and 224b-2 may be designed such that the distance between them is substantially the same as the offset distance of the first semiconductor chip 220 and the second semiconductor chip 230.

The first semiconductor chip 220 may include a first redistribution line insulation layer 221 and a second redistribution line insulation layer 226. The first redistribution line insulation layer 221 may be formed on the first active surface 220a in such a way as to expose the first bonding pads 222a and 222b. The second redistribution line insulation layer 226 may be formed on the first redistribution line insulation layer 221 in such a way as to cover the redistribution lines 224a and 224b. The second redistribution line insulation layer 226 may be formed to expose the first and second wire bonding pads 224a-1 and 224b-1 and the first and second redistribution line pads 224a-2 and 224b-2 of the redistribution lines 224a and 224b.

Referring again to FIG. 2, the second semiconductor chip 230 may be a memory chip which has substantially the same size and the same chip pad arrangement as the first semiconductor chip 220. The second semiconductor chip 230 may have a substantially quadrangular plate shape. The second semiconductor chip 230 may have a second active surface 230a and a second back surface 230b which faces away from the second active surface 230a. The second semiconductor chip 230 may include second bonding pads 232a and 232b which are arranged on the second active surface 230a.

Figure 4A:
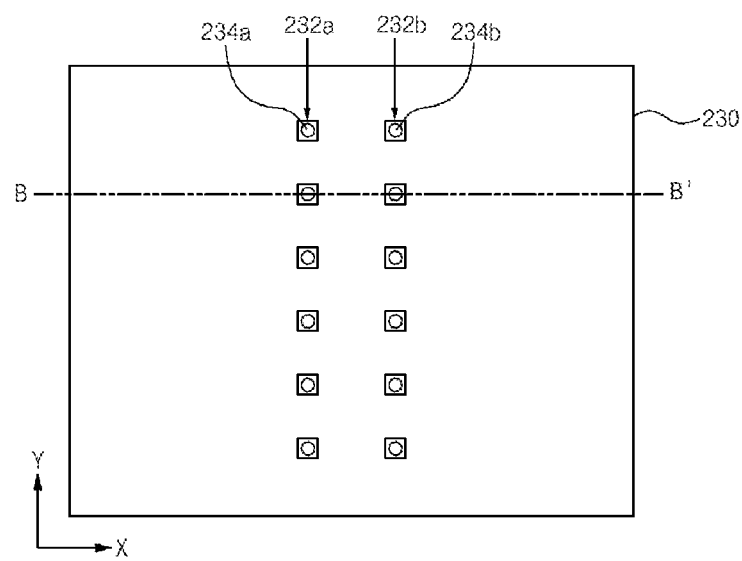
FIG. 4A is a plan view illustrating a representation of an example of the second semiconductor chip of the semiconductor package illustrated in FIG. 2.
Figure 4B:
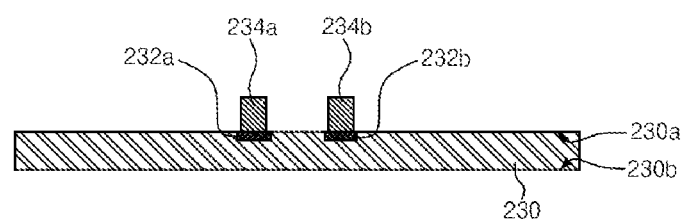
FIG. 4B is a cross-sectional view taken along the line B-B' of FIG. 4A.

Referring to FIGS. 4A and 4B, the second bonding pads 232a and 232b may be disposed by being separated from each other in the first direction X. The second bonding pads 232a and 232b may be arranged in two rows along the second direction Y substantially perpendicular to the first direction X on the middle portion of the second active surface 230a of the second semiconductor chip 230. In an embodiment, the second bonding pads 232a and 232b of the second semiconductor chip 230 have the same arrangement structure as the first bonding pads 222a and 222b of the first semiconductor chip 220.

The second semiconductor chip 230 may include bumps 234a and 234b which are formed on the second bonding pads 232a and 232b, respectively. For example, each of the bumps 234a and 234b may be any one among a copper post bump, a solder bump and a bump in which a plurality of metal layers are stacked.

Referring again to FIG. 2, the second semiconductor chip 230 may be disposed over the first active surface 220a of the first semiconductor chip 220 such that the second active surface 230a faces the first active surface 220a of the first semiconductor chip 220. For example, the second semiconductor chip 230 may be flip-chip bonded to the first semiconductor chip 220 by the medium of the bumps 234a and 234b. The second semiconductor chip 230 may be disposed such that it does not overlap completely with the first semiconductor chip 220 and is offset by a predetermined distance d1 from the first semiconductor chip 220. In other words, the second semiconductor chip 230 may be disposed over the first semiconductor chip 220 to form a staircase shape. The bumps 234a and 234b may be disposed to overlap with the redistribution line pads 224a-2 and 224b-2, respectively.

In an embodiment, one side second bonding pad 232b of the second semiconductor chip 230 is electrically coupled with the second redistribution line pad 224b-2 which is coupled with the other side first bonding pad 222b of the first semiconductor chip 220, through one side bump 234b. The other side second bonding pad 232a of the second semiconductor chip 230 is electrically coupled with the first redistribution line pad 224a-2 which is coupled with one side first bonding pad 222a of the first semiconductor chip 220, through the other side bump 234a.

The offset distance d1 between the second semiconductor chip 230 and the first semiconductor chip 220 may be the same as a pitch d2 between one side first bonding pad 222a and the second redistribution line pad 224b-2. The pitch d2 between one side first bonding pad 222a and the second redistribution line pad 224b-2 is the same as a pitch d2 between the other side first bonding pad 222b and the first redistribution line pad 224a-2. Namely, the second semiconductor chip 230 may be disposed over the first semiconductor chip 220 in such a way as to be offset by the pitch d2 between one side first bonding pad 222a and the second redistribution line pad 224b-2.

The bonding wires 250 may be formed to electrically couple the bond fingers 212a of the substrate 210 and the wire bonding pads 224a-1 and 224b-1 of the first semiconductor chip 220. In an embodiment, bonding wires 250 may be formed to couple the first wire bonding pads 224a-1 of the first semiconductor chip 220 with bond fingers 212a which are disposed adjacent to one side edge of the substrate 210. Bonding wires 250 may be formed to couple the second wire bonding pads 224b-1 of the first semiconductor chip 220 with bond fingers 212a which are disposed adjacent to the other side edge of the substrate 210.

The encapsulation member 260 may be formed to protect the first and second semiconductor chips 220 and 230 from external influences. The encapsulation member 260 may be formed on the top surface 210a of the substrate 210 including the solder resist 214 in such a way as to cover the first semiconductor chip 220 and the second semiconductor chip 230 which are stacked to be offset from each other and the bonding wires 250. The encapsulation member 260 may be formed to fill the space between the first semiconductor chip 220 and the second semiconductor chip 230. The encapsulation member 260 may be formed of epoxy molding compound.

The external coupling members 270 may be formed as means for mounting the semiconductor package 200 in accordance with the embodiments to a module substrate when manufacturing a memory module. The external coupling members 270 may be respectively formed on the external electrodes 212b which are arranged on the bottom surface 210b of the substrate 210. The external coupling members 270 may include solder balls. In an embodiment, the external coupling members 270 may include conductive pins or conductive pastes.

The above-described semiconductor package 200 in accordance with the embodiments may provide a structure in which chips are disposed to face each other and the respective pads of the chips are coupled with a substrate through a single redistribution line. The semiconductor package 200 having such a structure may have an input capacitance ($C_i$) that is decreased when compared to the conventional dual die package.

For example, the input capacitance $C_i$ of the conventional dual die package illustrated in FIG. 1 may be expressed as in the following Equation 1.

$$\text{Input capacitance } (C_i) = [(2 \times C_{rdl}) + (2 \times C_{die}) + C_{sub}] \quad \text{Equation 1}$$

The table 1 given hereunder represents the measured values of the input capacitance $C_i$ of the conventional dual die package.

TABLE 1

| Classification | $C_{die}$ | $C_{rdl}$ | $C_{sub}$ | Total |
|---|---|---|---|---|
| Individual $C_i$ [pF] | 0.5 | 0.4 | 0.7 | — |
| $C_i$ total [pF] | 1.0 | 0.8 | 0.7 | 2.5 |
| Percentage [%] | 40% | 32% | 28% | 100% |

In the Table 1, $C_{die}$ (die capacitance) designates the input capacitance of a chip, $C_{rdl}$ (RDL capacitance) designates the input capacitance of a redistribution line, $C_{sub}$ (substrate capacitance) designates the input capacitance of a substrate, and $C_i$ total designates a total input capacitance. Since the conventional dual die package has a structure in which 2 chips having respective redistribution lines are mounted to a substrate, $C_i$ total in terms of each of $C_{die}$ and $C_{rdl}$ is two times individual $C_i$, and $C_i$ total in terms of $C_{sub}$ is the same as individual $C_i$.

Referring to Table 1, it may be seen that the total input capacitance $C_i$ of the conventional dual die package is 2.5 pF and the input capacitance $C_{rdl}$ of a redistribution line occupies approximately 32%. The total input capacitance $C_i$ anticipated in the case where a DIMM as illustrated in FIG. 1 is realized by using such a package becomes 90 pF as expressed in the following Equation 2.

$$\text{Total input capacitance}(C_i) \text{ of DIMM} = 2.5 \text{ pF} \times 36 = 90 \text{ pF} \quad \text{Equation 2}$$

However, the input capacitance ($C_i$) of a semiconductor package in accordance with an embodiment may be expressed as in the following Equation 3.

$$\text{Input capacitance}(C_i) = [(C_{rdl}) + (2 \times C_{die}) + C_{sub}] \quad \text{Equation 3}$$

In a semiconductor package in accordance with an embodiment, since the $C_{rdl}$ component is decreased by 50% when compared to the conventional art, the total input capacitance $C_i$ becomes 2.1 pF as 0.4 pF is subtracted from the total input capacitance of 2.5 pF of the conventional art. Therefore, the total input capacitance $C_i$ of a memory module anticipated in the case where a DIMM as illustrated in FIG. 1 is realized by using the semiconductor package in accordance with an embodiment becomes 75.6 pF as expressed in the following Equation 4.

Total input capacitance($C_i$) of DIMM=2.1 pF×36=75.6 pF     Equation 4

The semiconductor package in accordance with an embodiment may have an input capacitance ($C_i$) that is decreased when compared to the conventional dual die package. Accordingly, the total input capacitance $C_i$ of a DIMM in which a semiconductor package in accordance with an embodiment is mounted is decreased as well.

The delay time of a signal in a substrate may be expressed simply as in the following Equation 5. It may be seen that the delay time is short as C is small.

$T(\text{time delay}) = \sqrt{L \times C}$     Equation 5

In Equation 5, L designates an inductance, and C designates a capacitance.

As a result, in an embodiment, an input capacitance $C_i$ may be decreased significantly when compared to the conventional art, through changing a package structure and optimizing a chip design. Therefore, in the case of realizing a high capacity memory module such as a DIMM by using the semiconductor package in accordance with an embodiment, when compared to a memory module realized by using the conventional dual die package, a signal delay time may be shortened through decreasing a total input capacitance $C_i$, and thus, the operation speed of the memory module may be improved.

Figure 6:
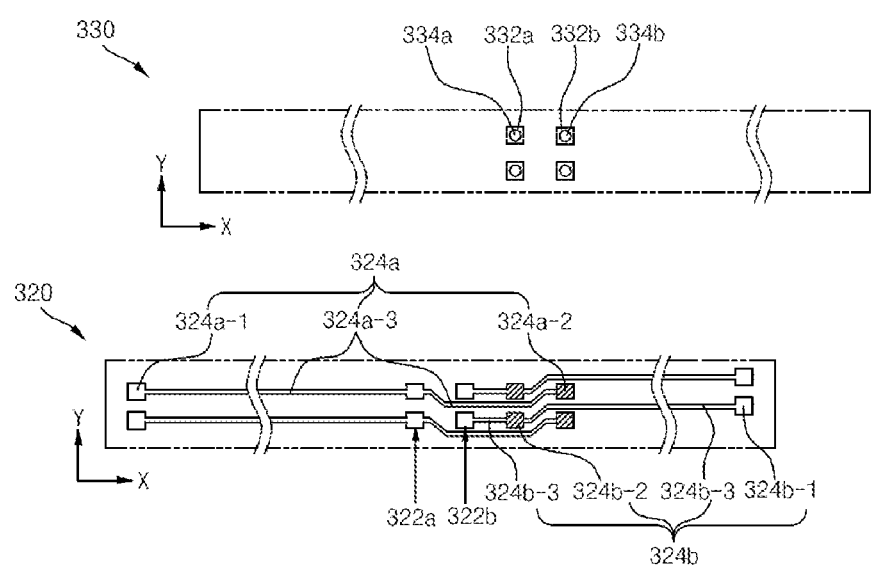
FIG. 6 is of partial plan views illustrating representations of examples of the first semiconductor chip and the second semiconductor chip of the semiconductor package illustrated in FIG. 5.

Referring to FIGS. 5 and 6, a semiconductor package 300 in accordance with an embodiment may include a substrate 310, a first semiconductor chip 320, and a second semiconductor chip 330. The semiconductor package 300 may further include an adhesive 340, bonding wires 350, an encapsulation member 360, and external coupling electrodes 370.

The substrate 310 may be a printed circuit board which has a substantially quadrangular plate shape. The substrate 310 may include bond fingers 312a which are arranged on a top surface 310a and external electrodes 312b which are arranged on a bottom surface 310b. The bond fingers 312a may be arranged adjacent to both side edges of the first semiconductor chip 320. The substrate 310 may include solder resists 314 which are formed on the top surface 310a and the bottom surface 310b in such a way as to expose the bond fingers 312a and the external electrodes 312b.

The first semiconductor chip 320 may be a memory chip which has a substantially quadrangular plate shape. The first semiconductor chip 320 may have a first active surface 320a and a first back surface 320b which faces away from the first active surface 320a. The first semiconductor chip 320 may be disposed on the top surface 310a of the substrate 310 by the medium of the adhesive 340 such that the first back surface 320b faces the top surface 310a of the substrate 310. The first semiconductor chip 320 may include first bonding pads 322a and 322b which are arranged in two rows on the middle portion of the first active surface 320a. The first semiconductor chip 320 may include redistribution lines 324a and 324b which are formed on the first active surface 320a.

For example, the following descriptions will be made on the assumption that, for the sake of convenience in explanation, one side indicates the left side and the other side indicates the right side in the drawings.

The redistribution lines 324a and 324b may include first redistribution lines 324a which extend from the middle portion to one side edge portion of the first active surface 320a of the first semiconductor chip 320 and second redistribution lines 324b which extend from the middle portion to the other side edge portion of the first active surface 320a of the first semiconductor chip 320. Each first redistribution line 324a may include a first wire bonding pad 324a-1, a first redistribution line pad 324a-2, and a first coupling line 324a-3 which couples the first wire bonding pad 324a-1 and the first redistribution line pad 324a-2 via one side first bonding pad 322a. Each second redistribution line 324b may include a second wire bonding pad 324b-1, a second redistribution line pad 324b-2, and a second coupling line 324b-3 which couples the second wire bonding pad 324b-1 and the other side first bonding pad 322b via the second redistribution line pad 324b-2. The first wire bonding pad 324a-1 may be disposed adjacent to one side edge of the first semiconductor chip 320. The first redistribution line pad 324a-2 may be disposed adjacent to the other side first bonding pad 322b between the other side first bonding pad 322b and the other side edge of the first semiconductor chip 320. The second wire bonding pad 324b-1 may be disposed adjacent to the other side edge of the first semiconductor chip 320. The second redistribution line pad 324b-2 may be disposed between the other side first bonding pad 322b and the first redistribution line pad 324a-2.

In an embodiment, one side first bonding pad 322a, the other side first bonding pad 322b, the first redistribution line pad 324a-2 and the second redistribution line pad 324b-2 may be disposed by being aligned in a line in the first direction X. According to this fact, when the second semiconductor chip 330 is stacked over the first semiconductor chip 320, the first semiconductor chip 320 and the second semiconductor chip 330 may form a staircase structure.

The first semiconductor chip 320 may include a first redistribution line insulation layer 321 and a second redistribution line insulation layer 326. The first redistribution line insulation layer 321 may be formed on the first active surface 320a in such a way as to expose the first bonding pads 322a and 322b. The second redistribution line insulation layer 326 may be formed on the first redistribution line insulation layer 321 in such a way as to cover the redistribution lines 324a and 324b. Also, the second redistribution line insulation layer 326 may be formed to expose the first and second wire bonding pads 324a-1 and 324b-1 and the first and second redistribution line pads 324a-2 and 324b-2 of the redistribution lines 324a and 324b.

The second semiconductor chip 330 may be a memory chip which has substantially the same size and the same chip pad arrangement as the first semiconductor chip 320. The second semiconductor chip 330 may have a second active surface 330a and a second back surface 330b which faces away from the second active surface 330a. The second semiconductor chip 330 may include second bonding pads 332a and 332b which are arranged on the second active surface 330a. The second bonding pads 332a and 332b may be arranged in two rows along the second direction Y on the middle portion of the second active surface 330a of the second semiconductor chip 330. The second semiconductor chip 330 may include bumps 334a and 334b which are formed on the second bonding pads 332a and 332b, respectively. Each of the bumps 334a and 334b may be, for example but not limited to, any one among a copper post bump, a solder bump and a bump in which a plurality of metal layers are stacked.

The second semiconductor chip 330 may be disposed over the first active surface 320a of the first semiconductor chip 320 such that the second active surface 330a faces the first active surface 320a of the first semiconductor chip 320. That is to say, the second semiconductor chip 330 may be flip-chip bonded to the first semiconductor chip 320 by the medium of the bumps 334a and 334b. The second semiconductor chip 330 may be disposed such that it does not overlap completely with the first semiconductor chip 320 and is offset by a predetermined distance from the first semiconductor chip 320. In other words, the second semiconductor chip 330 may be disposed over the first semiconductor chip 320 to form a staircase shape. The bumps 334a and 334b may be disposed to overlap with the redistribution line pads 324a-2 and 324b-2, respectively. In an embodiment, a pitch between the first side first bonding pad 322a and the second redistribution line pad 324b-2 is the same as an offset distance between the first semiconductor chip 320 and the second semiconductor chip 330.

In an embodiment, one side second bonding pad 332b of the second semiconductor chip 330 is electrically coupled with the second redistribution line pad 324b-2 which is coupled with the other side first bonding pad 322b of the first semiconductor chip 320, through one side bump 334b. The other side second bonding pad 332a of the second semiconductor chip 330 is electrically coupled with the first redistribution line pad 324a-2 which is coupled with one side first bonding pad 322a of the first semiconductor chip 320, through the other side bump 334a.

The bonding wires 350 may be formed to couple the bond fingers 312a of the substrate 310 and the wire bonding pads 324a-1 and 324b-1 of the first semiconductor chip 320. That is to say, bonding wires 350 may couple the first wire bonding pads 324a-1 of the first semiconductor chip 320 with bond fingers 312a which are disposed adjacent to one side edge of the substrate 310. Bonding wires 350 may be formed to couple the second wire bonding pads 324b-1 of the first semiconductor chip 320 with bond fingers 312a which are disposed adjacent to the other side edge of the substrate 310.

The encapsulation member 360 may be formed on the top surface 310a of the substrate 310 including the solder resist 314 in such a way as to cover the first semiconductor chip 320 and the second semiconductor chip 330 which are stacked to be offset from each other and the bonding wires 350. The encapsulation member 360 may be formed to fill the space between the first semiconductor chip 320 and the second semiconductor chip 330. The encapsulation member 360 may be formed of an epoxy molding compound.

The external coupling members 370 may be respectively formed on the external electrodes 312b which are arranged on the bottom surface 310b of the substrate 310. The external coupling members 370 may include solder balls. In an embodiment, the external coupling members 370 may include, for example but not limited to, conductive pins or conductive pastes.

Figure 7:
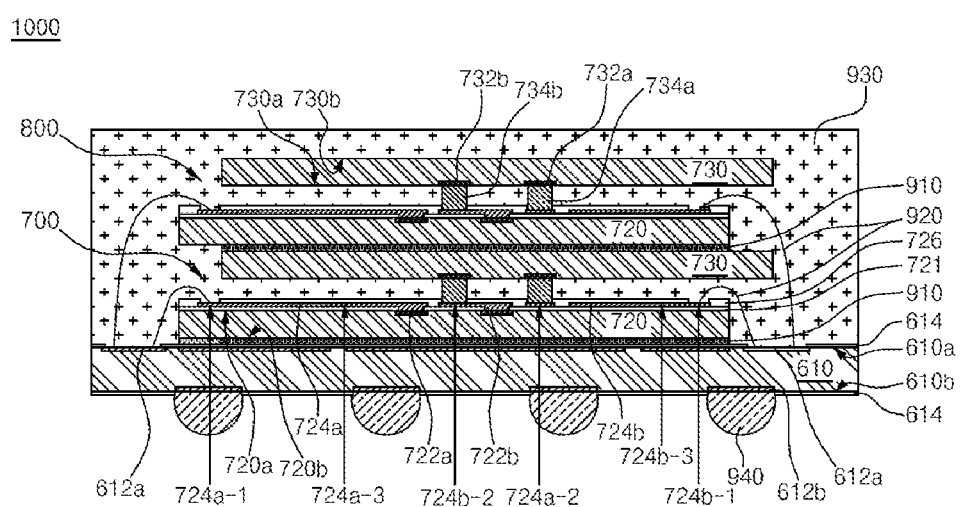
FIG. 7 is a cross-sectional view illustrating a representation of an example of a semiconductor package in accordance with an embodiment.

Referring to FIG. 7, a semiconductor package 1000 in accordance with an embodiment may include a substrate 610, a bottom stacked chip 700, and a top stacked chip 800. The semiconductor package 1000 may include adhesives 910, bonding wires 920, an encapsulation member 930, and external coupling electrodes 940.

The substrate 610 may be a printed circuit board. The substrate 610 may include bond fingers 612a which are arranged on a top surface 610a and external electrodes 612b which are arranged on a bottom surface 610b. The bond fingers 612a may be arranged adjacent to both side edges of the bottom stacked chip 700. The substrate 610 may include solder resists 614 which are formed on the top surface 610a and the bottom surface 610b in such a way as to expose the bond fingers 612a and the external electrodes 612b.

The bottom stacked chip 700 may include a first semiconductor chip 720 and a second semiconductor chip 730 which are stacked to be offset from each other.

The first semiconductor chip 720 may be a memory chip. The first semiconductor chip 720 may have a first active surface 720a and a first back surface 720b which faces away from the first active surface 720a. The first semiconductor chip 720 may be disposed on the top surface 610a of the substrate 610 by the medium of the adhesive 910 such that the first back surface 720b faces the top surface 610a of the substrate 610. The first semiconductor chip 720 may include first bonding pads 722a and 722b which are arranged on the middle portion of the first active surface 720a to be separated from each other. The first semiconductor chip 720 may include redistribution lines 724a and 724b which are formed on the first active surface 720a.

In the same manner as the redistribution lines 224a and 224b of the embodiment illustrated in FIG. 2, the redistribution lines 724a and 724b may include first redistribution lines 724a which extend from the middle portion to one side edge portion of the first active surface 720a of the first semiconductor chip 720 and second redistribution lines 724b which extend from the middle portion to the other side edge portion of the first active surface 720a of the first semiconductor chip 720. Each first redistribution line 724a may include a first wire bonding pad 724a-1, a first redistribution line pad 724a-2, and a first coupling line 724a-3 which couples the first wire bonding pad 724a-1 and the first redistribution line pad 724a-2 via one side first bonding pad 722a. Each second redistribution line 724b may include a second wire bonding pad 724b-1, a second redistribution line pad 724b-2, and a second coupling line 724b-3 which couples the second wire bonding pad 724b-1 and the second redistribution line pad 724b-2 via the other side first bonding pad 722b.

The first wire bonding pad 724a-1 may be disposed adjacent to one side edge of the first semiconductor chip 720. The first redistribution line pad 724a-2 may be disposed adjacent to the other side first bonding pad 722b between the other side first bonding pad 722b and the other side edge of the first semiconductor chip 720. The second wire bonding pad 724b-1 may be disposed adjacent to the other side edge of the first semiconductor chip 720. The second redistribution line pad 724b-2 may be disposed between one side first bonding pad 722a and the other side first bonding pad 722b. The first bonding pads 722a and 722b, the first redistribution line pad 724a-2 and the second redistribution line pad 724b-2 may be disposed by being aligned in a line in a first direction X as illustrated in FIG. 3A.

The first semiconductor chip 720 may include a first redistribution line insulation layer 721 and a second redistribution line insulation layer 726. The first redistribution line insulation layer 721 may be formed on the first active surface 720a in such a way as to expose the first bonding pads 722a and 722b. The second redistribution line insulation layer 726 may be formed on the first redistribution line insulation layer 721 in such a way as to cover the redistribution lines 724a and 724b. Also, the second redistribution line insulation layer 726 may be formed to expose the first and second wire bonding pads 724a-1 and 724b-1 and the first and second redistribution line pads 724a-2 and 724b-2 of the redistribution lines 724a and 724b.

The second semiconductor chip 730 may be a memory chip which has substantially the same size and the same chip pad arrangement as the first semiconductor chip 720. The second semiconductor chip 730 may have a second active surface 730a and a second back surface 730b which faces away from the second active surface 730a. The second semiconductor chip 730 may include second bonding pads 732a and 732b which are arranged on the second active surface 730a. The second semiconductor chip 730 may include bumps 734a and 734b which are formed on the second bonding pads 732a and 732b, respectively.

The second semiconductor chip 730 may be disposed over the first active surface 720a of the first semiconductor chip 720 such that the second active surface 730a of the second semiconductor chip 730 faces the first active surface 720a of the first semiconductor chip 720. That is to say, the second semiconductor chip 730 may be flip-chip bonded to the first semiconductor chip 720 by the medium of the bumps 734a and 734b. The bumps 734a and 734b may be disposed to overlap with the redistribution line pads 724a-2 and 724b-2, respectively. The second semiconductor chip 730 may be disposed such that it does not overlap completely with the first semiconductor chip 720 and is offset by a predetermined distance from the first semiconductor chip 720. In other words, the second semiconductor chip 730 may be disposed over the first semiconductor chip 720 to form a staircase shape.

The offset distance between the second semiconductor chip 730 and the first semiconductor chip 720 may be the same as a pitch between one side first bonding pad 722a and the second redistribution line pad 724b-2. The pitch between one side first bonding pad 722a and the second redistribution line pad 724b-2 is the same as a pitch between the other side first bonding pad 722b and the first redistribution line pad 724a-2. Namely, the second semiconductor chip 730 may be disposed over the first semiconductor chip 720 in such a way as to be offset by the pitch between one side first bonding pad 722a and the second redistribution line pad 724b-2.

In an embodiment, one side second bonding pad 732b of the second semiconductor chip 730 may be electrically coupled with the second redistribution line pad 724b-2 which is coupled with the other side first bonding pad 722b of the first semiconductor chip 720, through one side bump 734b. The other side second bonding pad 732a of the second semiconductor chip 730 may be electrically coupled with the first redistribution line pad 724a-2 which is coupled with one side first bonding pad 722a of the first semiconductor chip 720, through the other side bump 734a.

In the same manner as the bottom stacked chip 700, the top stacked chip 800 may include a first semiconductor chip 720 and a second semiconductor chip 730 which are stacked to be offset from each other. The first semiconductor chip 720 and the second semiconductor chip 730 of the top stacked chip 800 have the same constructions as those of the bottom stacked chip 700.

The top stacked chip 800 may be disposed on the second back surface 730b of the second semiconductor chip 730 of the bottom stacked chip 700 by the medium of the adhesive 910.

The bonding wires 920 may be formed to electrically couple the bond fingers 612a of the substrate 610 and the adjacent wire bonding pads 724a-1 and 724b-1 of the first semiconductor chips 720 of the bottom stacked chip 700 and the top stacked chip 800.

The encapsulation member 930 may be formed on the top surface 610a of the substrate 610 including the solder resist 314 in such a way as to cover the bottom stacked chip 700, the top stacked chip 800 and the bonding wires 920. The encapsulation member 930 may be formed to fill the spaces between the first semiconductor chip 720 and the second semiconductor chip 730 in the bottom stacked chip 700 and the top stacked chip 800.

The external coupling members 940 may be respectively formed on the external electrodes 612b which are arranged on the bottom surface 610b of the substrate 610. The external coupling members 940 may include solder balls. In an embodiment, the external coupling members 940 may include, for example but not limited to, conductive pins or conductive pastes.

The semiconductor packages in accordance with the above-described various embodiments may be applied to various kinds of electronic systems and memory cards.

Figure 8:
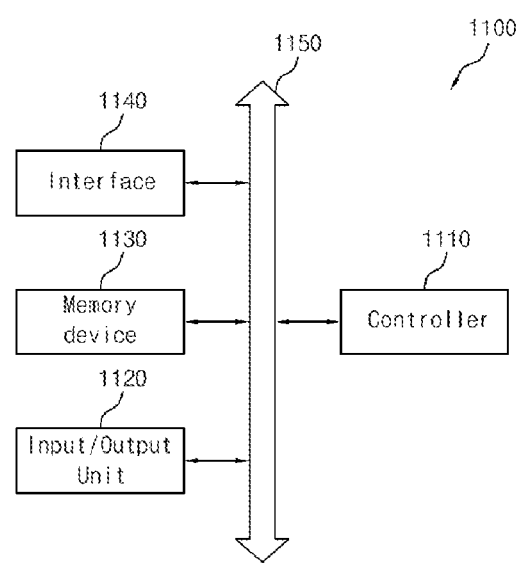
FIG. 8 is a block diagram illustrating a representation of an example of an electronic system to which the semiconductor packages in accordance with the various embodiments may be applied.

Referring to FIG. 8, an electronic system 1100 may include the semiconductor packages according to the above-described various embodiments. The electronic system 1100 may include a controller 1110, an input and output (input/output) unit 1120, and a memory device 1130. The controller 1110, the input/output unit 1120 and the memory device 1130 may be coupled with one another through a bus 1150 which provides data movement paths.

For example, the controller 1110 may include at least any one of a microprocessor, a digital signal processor, a microcontroller, and logic devices capable of performing similar functions to these components. The controller 1110 and the memory device 1130 may include the semiconductor packages in accordance with the above-described various embodiments. The input/output unit 1120 may include any one selected among a keypad, a keyboard, a display device, and so forth.

The memory device 1130 may store data and/or commands to be executed by the controller 1110. The memory device 1130 may include a volatile memory device such as a DRAM and/or a nonvolatile memory device such as a flash memory. For example, a flash memory may be mounted to an information processing system such as a mobile terminal and a desktop computer. Such a flash memory may be configured by an SSD (solid state drive). In this case, the electronic system 1100 may stably store a large amount of data in a flash memory system.

Such an electronic system 1100 may further include an interface 1140 for transmitting data to a communication network or receiving data from a communication network. The interface 1140 may be a wired or wireless type. For example, the interface 1140 may include an antenna or a wired/wireless transceiver.

Although not illustrated, the electronic system 1100 may further include an application chipset, a camera image processor (CIP), and so forth.

The electronic system 1100 may be realized as a mobile system, a personal computer, a computer for an industrial use or a logic system which performs various functions. For example, the mobile system may be any one among a personal digital assistant (PDA), a portable computer, a web tablet, a mobile phone, a smart phone, a wireless phone, a laptop computer, a memory card, a digital music system and an information transmission/reception system.

In the case where the electronic system 1100 is equipment capable of performing wireless communication, the electronic system 1100 may be used in a communication system such as CDMA (code division multiple access), GSM (global system for mobile communication), NADC (North American digital cellular), E-TDMA (enhanced-time division multiple access), WCDMA (wideband code division multiple access), CDMA2000, LTE (long term evolution) and Wibro (wireless broadband Internet).

Figure 9:
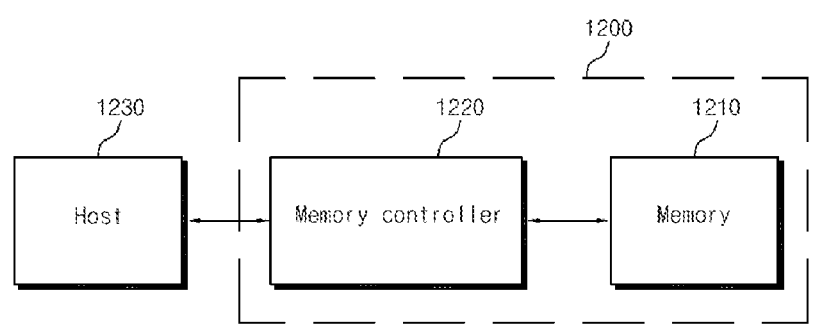
FIG. 9 is a block diagram illustrating a representation of an example of a memory card which may include the semiconductor packages in accordance with the various embodiments.

Referring to FIG. 9, a memory card may include the semiconductor packages according to the above-described various embodiments. For instance, a memory card 1200 may include a memory 1210 such as a nonvolatile memory device and a memory controller 1220. The memory 1210 and the memory controller 1220 may store data or read stored data. The memory 1210 may include at least any one among nonvolatile memory devices to which the semiconductor packages in accordance with the above-described various embodiments are applied. The memory controller 1220 may control the memory 1210 to read stored data or store data, in response to a read and write (read/write) request from a host 1230.

While various embodiments have been described above, it will be understood to those skilled in the art that the embodiments described are by way of example only. Accordingly, the stack type semiconductor package having a redistribution line structure described herein should not be limited based on the described embodiments.

What is claimed is:

1. A semiconductor package comprising:
a first semiconductor chip having first bonding pads which are arranged in two rows on a middle portion of a first active surface;
a second semiconductor chip having substantially the same size as the first semiconductor chip, and having second bonding pads which are arranged in two rows on a middle portion of a second active surface;
redistribution lines formed on the first active surface, and corresponding to the first bonding pads, respectively, the redistribution lines each having a redistribution line pad, a wire bonding pad, and coupling lines electrically coupling the redistribution line pad, the wire bonding pad and the corresponding first bonding pad; and
bumps formed on the second bonding pads of the second semiconductor chip, respectively,
wherein the location of the second bonding pads in relation to the second semiconductor chip is the same as the location of the corresponding first bonding pads in relation to the first semiconductor chip,
wherein the first semiconductor chip and the second semiconductor chip are stacked such that the first active surface and the second active surface face each other, and are disposed to be offset from each other, and
wherein the bumps are bonded to the redistribution line pads of the redistribution lines, respectively.

2. The semiconductor package according to claim 1, wherein the redistribution lines comprise:
a first redistribution line coupled with one side first bonding pad of the first bonding pads arranged in two rows, and extending toward one side edge of the first semiconductor chip; and
a second redistribution line coupled with an other side first bonding pad of the first bonding pads arranged in two rows, and extending toward an other side edge of the first semiconductor chip,
wherein the second bonding pads of the second semiconductor chip include one side second bonding pad and an other side second bonding pad, and
wherein the bumps include one side bump which is formed on the one side second bonding pad and an other side bump which is formed on the other side second bonding pad.

3. The semiconductor package according to claim 2, wherein the first redistribution line comprises:
a first wire bonding pad disposed adjacent to the one side edge;
a first redistribution line pad disposed adjacent to the other side first bonding pad between the other side first bonding pad and the other side edge; and
a first coupling line coupling the first wire bonding pad and the first redistribution line pad via the one side first bonding pad, and
wherein the second redistribution line comprises:
a second wire bonding pad disposed adjacent to the other side edge;
a second redistribution line pad disposed between the one side first bonding pad and the other side first bonding pad; and
a second coupling line coupling the second wire bonding pad and the second redistribution line pad via the other side first bonding pad.

4. The semiconductor package according to claim 3, wherein the one side and the other side first bonding pads and the first and second redistribution line pads are disposed by being aligned in a line on the first active surface of the first semiconductor chip.

5. The semiconductor package according to claim 3, wherein a pitch between the one side first bonding pad and the second redistribution line pad is the same as an offset distance between the first semiconductor chip and the second semiconductor chip.

6. The semiconductor package according to claim 3,
wherein the one side second bonding pad is electrically coupled with the second redistribution line pad through the one side bump, and
wherein the other side second bonding pad is electrically coupled with the first redistribution line pad through the other side bump.

7. The semiconductor package according to claim 6,
wherein the one side first bonding pad of the first semiconductor chip and the other side second bonding pad of the second semiconductor chip are electrically coupled with each other through the other side bump which is formed on the other side second bonding pad and a first redistribution line pad which is electrically coupled with the other side bump and is coupled with the one side first bonding pad, and
wherein the other side first bonding pad of the first semiconductor chip and the one side second bonding pad of the second semiconductor chip are electrically coupled with each other through the one side bump which is formed on the one side second bonding pad and a second redistribution line pad which is electrically coupled with the one side bump and is coupled with the other side first bonding pad.

8. The semiconductor package according to claim 2,
wherein the first redistribution line comprises:
a first wire bonding pad disposed adjacent to the one side edge;
a first redistribution line pad disposed adjacent to the other side first bonding pad between the other side first bonding pad and the other side edge; and
a first coupling line coupling the first wire bonding pad and the first redistribution line pad via the one side first bonding pad, and
wherein the second redistribution line comprises:
a second wire bonding pad disposed adjacent to the other side edge;
a second redistribution line pad disposed between the other side first bonding pad and the first redistribution line pad; and
a second coupling line coupling the second wire bonding pad and the other side first bonding pad via the second redistribution line pad.

9. The semiconductor package according to claim 8, wherein the one side and the other side first bonding pads and the first and second redistribution line pads are disposed by being aligned in a line.

10. The semiconductor package according to claim 8, wherein a pitch between the first side first bonding pad and the second redistribution line pad is the same as an offset distance between the first semiconductor chip and the second semiconductor chip.

11. The semiconductor package according to claim 8,
wherein the one side second bonding pad of the second semiconductor chip is electrically coupled with the second redistribution line pad of the first semiconductor chip through the one side bump, and
wherein the other side second bonding pad of the second semiconductor chip is electrically coupled with the first redistribution line pad of the first semiconductor chip through the other side bump.

12. The semiconductor package according to claim 11,
wherein the one side first bonding pad of the first semiconductor chip and the other side second bonding pad of the second semiconductor chip are electrically coupled with each other through the other side bump which is formed on the other side second bonding pad and a first redistribution line pad which is electrically coupled with the other side bump and is coupled with the one side first bonding pad, and
wherein the other side first bonding pad of the first semiconductor chip and the one side second bonding pad of the second semiconductor chip are electrically coupled with each other through the one side bump which is formed on the one side second bonding pad and a second redistribution line pad which is electrically coupled with the one side bump and is coupled with the other side first bonding pad.

13. The semiconductor package according to claim 1, wherein the first semiconductor chip further has a first redistribution line insulation layer which is formed over the first active surface to expose the first bonding pads, and a second redistribution line insulation layer which is formed on the first redistribution line insulation layer to cover the redistribution lines and expose the wire bonding pads and the redistribution line pads of the redistribution lines.

14. The semiconductor package according to claim 1, further comprising:
a substrate having a top surface on which bond fingers are arranged and a bottom surface on which external electrodes are arranged, and disposed such that the top surface faces a first back surface facing away from the first active surface of the first semiconductor chip; and
bonding wires formed to couple the bond fingers and the wire bonding pads.

15. The semiconductor package according to claim 14,
wherein the bond fingers are arranged on portions of the top surface of the substrate which are adjacent to both side edges of the first semiconductor chip, and
wherein the bonding wires are formed to couple the bond fingers and the wire bonding pads adjacent to both side edges of the first semiconductor chip.

16. The semiconductor package according to claim 14, further comprising:
an adhesive interposed between the first back surface of the first semiconductor chip and the top surface of the substrate.

17. The semiconductor package according to claim 14, further comprising:
a third semiconductor chip having a first back surface facing a second back surface of the second semiconductor chip, and a first active surface facing away from the second back surface of the second semiconductor chip;
a fourth semiconductor chip having a second active surface facing the first active surface of the third semiconductor chip and a second back surface facing away from the first active surface of the third semiconductor chip; and
an adhesive interposed between the first back surface of the third semiconductor chip and the second back surface of the second semiconductor chip,
wherein the third semiconductor chip and the fourth semiconductor chip are disposed to be offset from each other.

18. The semiconductor package according to claim 14, further comprising:
an encapsulation member formed on the top surface of the substrate to cover the first and second semiconductor chips and the bonding wires; and
external coupling terminals formed on the external electrodes.

19. The semiconductor package according to claim 18, wherein the encapsulation member is filled in a space between the first semiconductor chip and the second semiconductor chip.

20. A semiconductor package comprising:
a first semiconductor chip having first bonding pads which are arranged on a first active surface of the first semiconductor chip;
a second semiconductor chip having second bonding pads which are arranged on a second active surface of the second semiconductor chip;
redistribution lines formed on the first active surface, and corresponding to the first bonding pads, respectively, the redistribution lines each having a redistribution line pad, a wire bonding pad, and coupling lines electrically coupling the redistribution line pad, the wire bonding pad and the corresponding first bonding pad; and
bumps formed on the second bonding pads of the second semiconductor chip, respectively,
wherein the location of the second bonding pads in relation to the second semiconductor chip is the same as the location of the corresponding first bonding pads in relation to the first semiconductor chip,
wherein the first semiconductor chip and the second semiconductor chip are stacked such that the first active surface and the second active surface face each other, and are disposed to be offset from each other, and
wherein the bumps are bonded to the redistribution line pads of the redistribution lines, respectively.

* * * * *